(12) United States Patent  
Bonora et al.

(10) Patent No.: US 6,575,687 B2  
(45) Date of Patent: Jun. 10, 2003

(54) WAFER TRANSPORT SYSTEM

(75) Inventors: Anthony C. Bonora, Menlo Park, CA (US); Robert R. Netsch, Piedmont, CA (US); Richard Gould, Fremont, CA (US)

(73) Assignee: Asyst Technologies, Inc., Fremont, CA (US)

( * ) Notice: Subject to any disclaimer, the term of this patent is extended or adjusted under 35 U.S.C. 154(b) by 0 days.

(21) Appl. No.: 09/729,737

(22) Filed: Dec. 4, 2000

(65) Prior Publication Data

US 2002/0067981 A1 Jun. 6, 2002

Related U.S. Application Data

(60) Provisional application No. 60/168,797, filed on Dec. 2, 1999.

(51) Int. Cl.[7] ............................................... B65G 49/07
(52) U.S. Cl. .................. 414/217; 414/217.1; 414/805; 414/940
(58) Field of Search ........................ 414/217, 217.1, 414/222.01, 222.09, 403, 404, 416.01–416.12, 609, 754, 783, 805, 811, 940; 198/409

(56) References Cited

U.S. PATENT DOCUMENTS

| | | | |
|---|---|---|---|
| 4,636,128 A | 1/1987 | Millis et al. | 414/217 |
| 4,744,715 A | 5/1988 | Kawabata | 414/331 |
| 5,570,990 A * | 11/1996 | Bonora et al. | 414/618 |
| 5,655,869 A | 8/1997 | Scheler et al. | 414/222 |
| 5,713,711 A | 2/1998 | McKenna et al. | 414/217 |
| 5,746,008 A * | 5/1998 | Yamashita et al. | 34/211 |
| 5,788,458 A | 8/1998 | Bonora et al. | 414/786 |
| 5,885,045 A * | 3/1999 | Rush | 414/754 |
| 5,980,183 A | 11/1999 | Fosnight | 414/222.01 |
| 6,079,927 A | 6/2000 | Muka | 414/217 |
| 6,129,496 A * | 10/2000 | Iwasaki et al. | 414/222.01 |
| 6,135,698 A | 10/2000 | Bonora et al. | 414/416 |
| 6,281,516 B1 * | 8/2001 | Bacchi et al. | 250/559.29 |
| 6,283,692 B1 * | 9/2001 | Perlov et al. | 414/222.01 |
| 6,318,953 B1 * | 11/2001 | Bonora et al. | 414/754 |

FOREIGN PATENT DOCUMENTS

EP 552756 * 7/1993 ................. 414/940

* cited by examiner

Primary Examiner—James W. Keenan  
(74) Attorney, Agent, or Firm—O'Melveny & Myers LLP (57) ABSTRACT

A wafer transport mechanism is disclosed capable of transferring workpiece cassettes between lot boxes and SMIF pods. The transport mechanism includes a frame having a first support platform on a first side of the frame for supporting a SMIF pod, and a second support platform on a second side of the frame for supporting a lot box. The frame further includes a carrier transfer mechanism which resides completely within the frame when in a home position. The transfer mechanism includes an arm and a gripper pivotally mounted to the arm. Once a SMIF pod and lot box are seated on their respective support platforms, the transfer mechanism transfers a cassette between the two containers.

10 Claims, 6 Drawing Sheets

WAFER TRANSPORT SYSTEM

The present application claims priority to U.S. Provisional Patent Application Serial No. 60/168,797, entitled, "WAFER TRANSPORT SYSTEM", which application was filed on Dec. 2, 1999.

BACKGROUND OF THE INVENTION

1. Field of the Invention

The present invention relates to a transfer system for use in a semiconductor wafer fab operating with both sealed SMIF pods and open lot carrier boxes, and in particular to a transport system for transferring workpiece carriers between SMIF pods and lot carrier boxes.

2. Description of Related Art

A typical semiconductor wafer fab includes a plurality of tool bays, each on the order of about eighty feet long, consisting in general of a number of processing tools for performing various wafer fabrication processes, and at least one stocker, where the wafers may be stored before and/or after processing. Various automated transport systems are further provided for transporting the wafers from one processing tool bay to another (interbay delivery systems), and for transporting the wafers around within each particular bay (intrabay delivery systems).

The wafers are transported around the fab within cassettes, which cassettes are themselves transported either bare or housed within enclosed containers. One type of conventional enclosed container is a so-called wafer lot carrier box ("lot box") which encloses the wafers but does not seal the wafers off against the fab environment.

A second type of conventional container is a so-called standard mechanical interface ("SMIF") pod which is sealed against the fab environment. A SMIF system proposed by the Hewlett-Packard Company is disclosed in U.S. Pat. Nos. 4,532,970 and 4,534,389. The purpose of a SMIF system is to reduce particle fluxes onto semiconductor wafers during storage and transport of the wafers through the semiconductor fabrication process. This purpose is accomplished, in part, by mechanically ensuring that during storage and transport, the gaseous media (such as air or nitrogen) surrounding the wafers is essentially stationary relative to the wafers, and by ensuring that particles from the ambient environment do not enter the immediate wafer environment.

A SMIF system in general has three main components: (1) the sealed pods used for storing and transporting wafer cassettes; (2) a minienvironment supplied with ultraclean air flows surrounding cassette load ports and wafer processing areas of processing stations so that the environments inside the pods and minienvironment become miniature clean spaces; and (3) robotic input/output (I/O) transfer assemblies to transfer the wafer cassettes and/or wafers between the sealed pods and the processing equipment without contamination of the wafers in the wafer cassette from external environments.

The SMIF system is able to maintain the wafers in an ultraclean environment that is at least an order of magnitude cleaner than the environment of the surrounding wafer fab. Typical advanced semiconductor processes today employ geometries which are one-half micron ($\mu$m) and under, and contamination particles having geometries of as little as 0.1 $\mu$m can be very damaging to the processed semiconductor. As such, the SMIF solution is becoming widely used as a means for transporting semiconductor wafers around the wafer fab and between process tools in a substantially particle-free environment.

While SMIF technology provides significant advantages over conventional lot box transport, many fabs still have systems employing the latter. There is at present a need for an approach allowing a wafer fab to operate with both lot boxes and SMIF pods.

SUMMARY OF THE INVENTION

It is therefore an advantage of the present invention to provide a system allowing a wafer fab to operate with both lot boxes and SMIF pods.

It is a further advantage of the present invention to provide a mechanism capable of transporting workpiece carriers between lot boxes and SMIF pods.

It is another advantage of the present invention to provide a system where workpiece carriers may be positioned at the carrier transport mechanism by a stationary support platform mounted to the transport mechanism or by automated car which transports the carrier around the fab.

These and other advantages are provided by the present invention, which in preferred embodiments relates to a wafer transport mechanism capable of transferring workpiece cassettes between lot boxes and SMIF pods. The transport mechanism includes a frame having a first support platform on a first side of the frame for supporting a SMIF pod, and a second support platform on a second side of the frame for supporting a lot box. The frame further includes a carrier transfer mechanism which resides completely within the frame when in a home position. The transfer mechanism includes an arm and a gripper pivotally mounted to the arm.

A SMIF pod and lot box are initially loaded onto their respective platforms, and opened. Once the tops have been lifted, the gripper is positioned adjacent a cassette in the lot box, where it grips the handle on top of the cassette. The workpieces within the cassette are initially vertically oriented. The transfer mechanism lifts and rotates the cassette so that the workpieces are then oriented in a substantially horizontal plane. The transfer mechanism then sets the cassette down on the pod door seated on the first support platform. Thereafter, the pod top is lowered to once again mate with the pod door, and the latching mechanism within the pod door couples the top and door together so that the pod is sealed. The pod may thereafter be transferred away from the first support platform. The same process may be carried out in the reverse to transfer a workpiece cassette from the SMIF pod on the first support platform to the lot box on the second support platform.

In a preferred embodiment, the first and second support platforms are fixedly mounted to the frame. However, in an alternative embodiment, the support platform for supporting the SMIF pod and/or the lot box may be provided on an automated car for transporting the SMIF pod and/or lot box around the fab. When it is desired to drop off or acquire a wafer cassette, the car is positioned adjacent the frame, and cassette transfer is accomplished as described above.

BRIEF DESCRIPTION OF THE DRAWINGS

The present invention will now be described with reference to the drawings in which.

DETAILED DESCRIPTION

The present invention will now be described with reference to FIGS. 1–6 which in preferred embodiments relates to a transport system for transferring workpiece carriers between SMIF pods and lot carrier boxes. It is understood that the workpieces transported within the carriers are not critical to the present invention and may comprise semiconductor wafers, reticles and flat panel displays.

Figure 1:
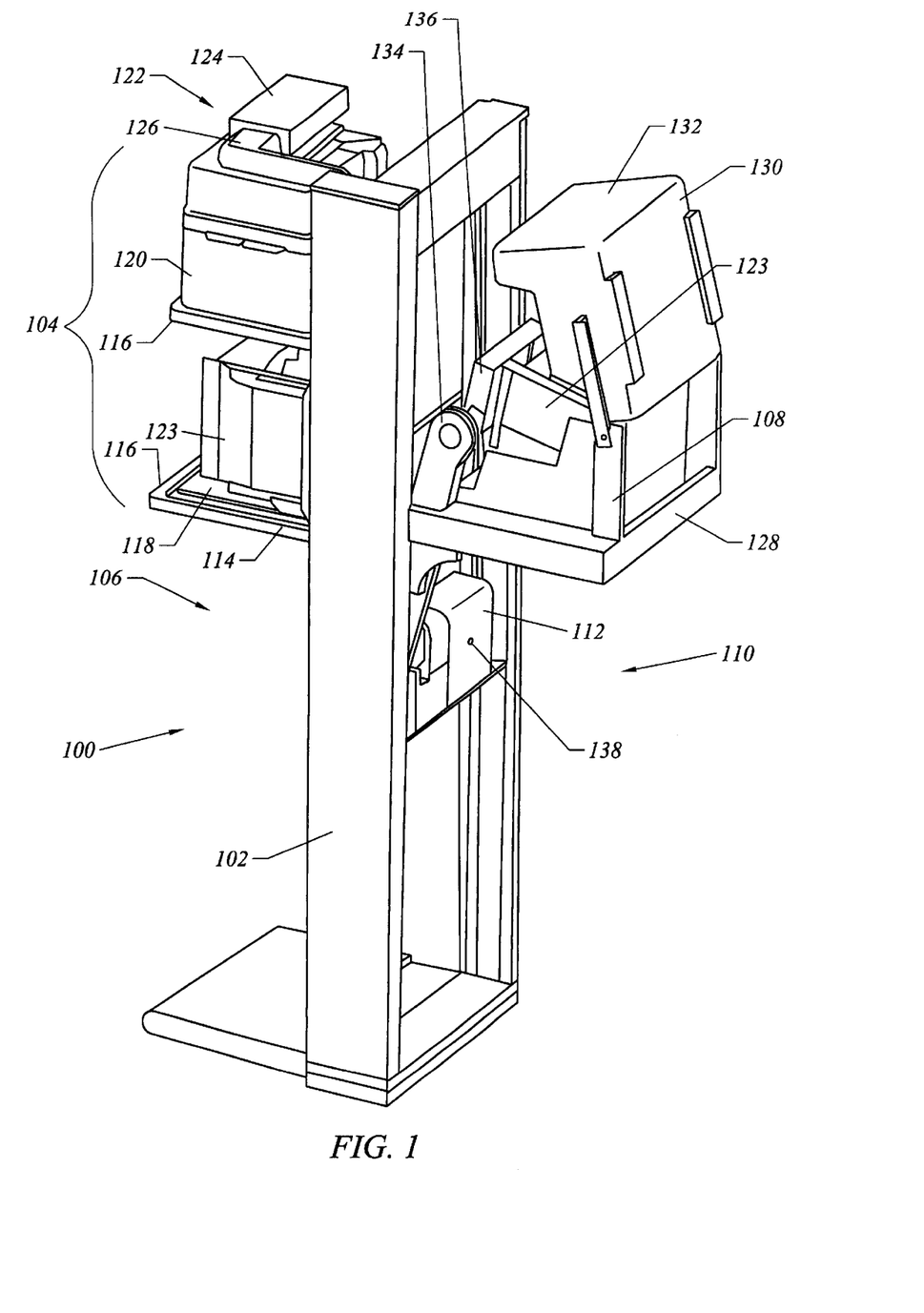
FIG. 1 is a perspective view of a workpiece transport mechanism according to the present invention.

Referring now to FIG. 1, the wafer transfer mechanism 100 according to the present invention comprises a frame 102 for supporting the mechanism 100 on the floor, or mounting the mechanism 100 to a wall or ceiling portion of the wafer fab. The mechanism 100 further includes a SMIF pod opener 104 affixed to a first side 106 of the frame 102, a lot box opener 108 on a second side 110 of the frame 102 opposite first side 106, and a cassette transfer assembly 112 mounted within frame 102. The mechanism 100 is controlled by a computer (not shown) either dedicated to the mechanism 100 or responsible for controlling semiconductor processing operations in the fab in general.

The SMIF pod opener 104 comprises a support platform 114 stationarily mounted to frame 102 for receiving a SMIF pod 116 thereon. Although not critical to the present invention, the height of the platform 114 is preferably at the SEMI designated height of 900 mm. The pod 116 may be either manually or automatedly loaded onto the platform 114. As explained hereinafter, the platform 114 may be omitted in alternative embodiments, and the pod brought adjacent the frame 102 via an automated car which transports the pod 116 around the fab. In the embodiment shown in FIG. 1, the support platform 114 preferably includes kinematic pins or other registration features which mate within slots or corresponding shaped depressions on a bottom surface of pod 116 to ensure a fixed and repeatable position of the pod on the support platform.

A latching mechanism (not shown) is further provided within the platform 114 for decoupling a pod door 118 from a pod top 120 of the pod 116. Details relating to a latching mechanism for use with the present invention are described in U.S. Pat. No. 4,995,430, entitled "Sealable Transportable Container Having Improved Latch Mechanism", which application is assigned to the owner of the present application and is incorporated by reference in its entirety herein. As would be appreciated by those skilled in the art, the decoupling mechanism may be comprised of structures other than that disclosed in the above-identified patent.

Once the pod door is decoupled from the pod top, a pod top lifter 122 of the pod opener 104 lifts the pod top away from the pod door to allow access to a wafer-carrying cassette 123 seated therein. The pod top lifter 122 includes a gripper 124 mounted to an arm 126. Arm 126 is in turn mounted to a linear drive (not shown) in the interior side wall of the frame 102 capable of vertically translating the arm, gripper and pod top. In one embodiment of the linear drive, a portion of the arm is threaded around a lead screw (not shown) in the interior side wall of frame 102. A conventional drive motor, such as a stepper or brushless motor (not shown) is further mounted on the arm, which motor drives the translation of the arm along the lead screw in response to control signals from the computer.

In a preferred embodiment, the gripper 124 may comprise an active gripper of known construction including moving jaws that grasp and release a handle on a top of the pod top. It is contemplated that a passive gripper could be used with the addition of a linear drive between the arm 126 and gripper 124 capable of imparting lateral motion to the gripper 124 so that it can move horizontally away from the pod top handle. It is understood that instead of gripper 124, other gripping mechanisms maybe used to grip the pod top (either at its top or sides) and lift the pod top away.

It is understood that in alternative embodiments, the arm 126 may be stationarily mounted to frame 102 and the platform 114 instead mounted to a linear drive in the side of the frame to translate the pod door and cassette down away from the stationary pod top.

Lot box opener 108 is of known construction and comprises a platform 128 including registration features for receiving lot box 130 in a fixed and repeatable position. As in SMIF pod 116, lot box 130 maybe loaded onto the platform 128 manually or automatedly, and the platform may be omitted in alternative embodiments where an automated car brings the lot box 130 directly adjacent frame 102. Once seated on platform 128, mechanisms in opener 108 of known construction lift a top 132 of the lot box 130 upward to allow access to a cassette 123 seated therein. The pod 116 and box 130 are configured to support identical cassettes. However, the lot box transports cassettes with the wafers oriented substantially vertically and the SMIF pod transports cassettes with the wafers oriented substantially horizontally.

Cassette transfer system 112 is reciprocatingly mounted in the frame 102, and includes a transfer arm 134 and a gripper 136. In its home position (not shown), the arm 134 and gripper 136 are preferably vertically oriented completely within the horizontal footprint of the frame 102 so as to take up a minimal amount of space and does not add to the thickness of the frame. The arm 134 is rotatably mounted to a chassis 138, which chassis is in turn translatably mounted by a linear drive (not shown) to frame 102. In one embodiment of the linear drive, a portion of the chassis is threaded around a lead screw (not shown) in the interior side wall of frame 102. A conventional drive motor, such as a stepper or brushless motor (not shown) is further mounted on the chassis 138, which motor drives the translation of the chassis along the lead screw in response to control signals from the computer.

Separate and independent from the rotational mounting of a proximal end of the arm 134 to the chassis 138, the gripper 136 is rotationally mounted to a distal end of arm 134 so that the arm 134 and gripper 136 may rotate separately and simultaneously. In one embodiment, the gripper 136 may comprise an active gripper of known construction including moving jaws that grasp and release a handle on a top of the cassette. As is known in the art, the computer controls the rotation and/or translation of the arm 134 and gripper 136 so that the gripper 136 may be properly positioned to grip and transfer a cassette between the pod 116 and box 130 as explained hereinafter.

The operation of the present invention will now be described with reference to FIGS. 1 and 2. In order to transfer a cassette from lot box 130 to SMIF pod 16, the pod and box are loaded onto their respective platforms as described above and as shown in "Step 1" of FIG. 2. (FIG.

2 in fact shows an automated car, explained hereinafter, instead of platform 114 for supporting the pod 116 at the frame. However, once adjacent the frame, the automated car and platform 114 serve the same functions.) Once the pod and box are seated on the platforms, the pod top 120 and lot top 132 are raised upwards as shown in "Step 2" of FIG. 2. Although a cassette 123 is shown in both pod 116 and box 130 in FIG. 1 for ease of understanding, it is understood that in a preferred embodiment the cassette would be in one or the other in operation as shown in FIG. 2. However, as explained hereinafter, it is contemplated that cassettes could be located initially in both pod 116 and box 130 in alternative embodiments.

Figure 2:
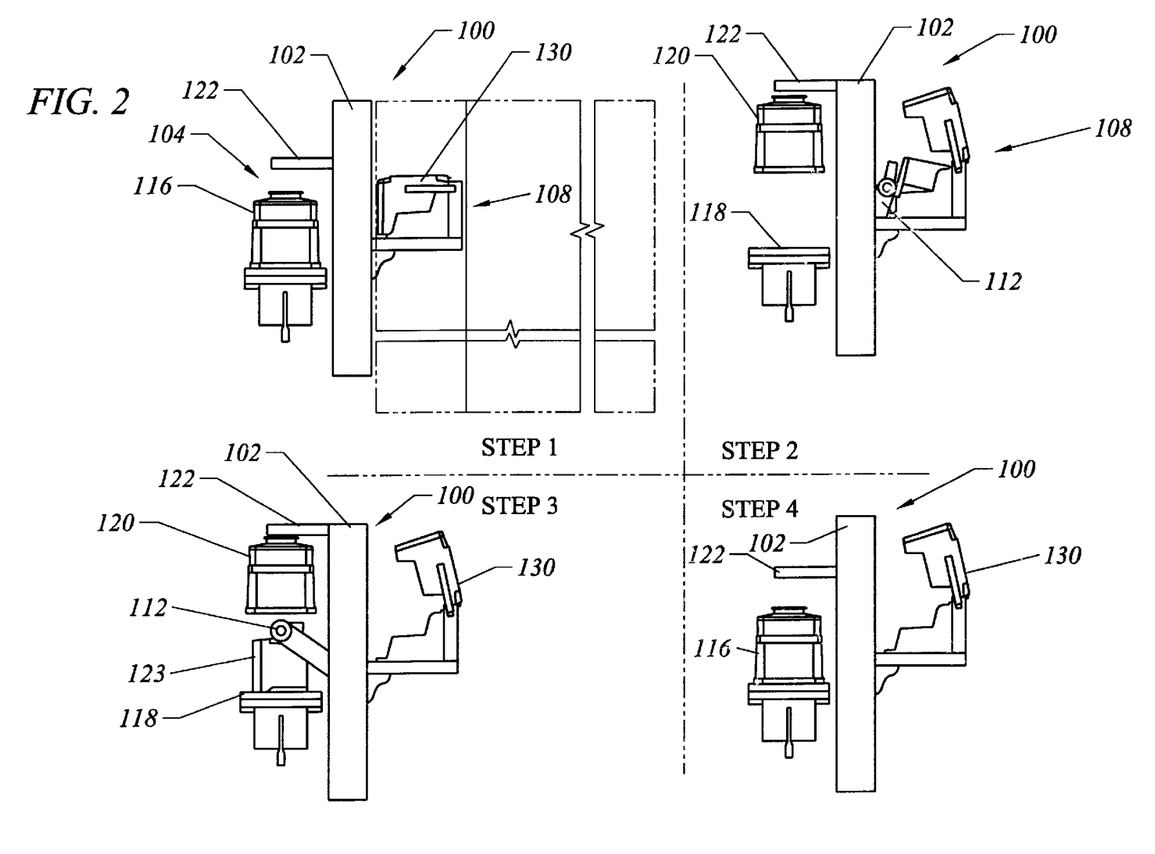
FIG. 2 illustrates four side views of the workpiece transport mechanism according to the present invention.

Once the tops have been lifted, the gripper 136 is positioned adjacent the cassette in the lot box, where it grips the handle on top of the cassette as shown in FIGS. 1 and 2. Thereafter, the transfer system 112 lifts and rotates the cassette (clockwise with respect to the view shown in "Step 2" of FIG. 2) so that the wafers are then oriented in a substantially horizontal plane. The transfer system 112 then sets the cassette down on the pod door 118 on platform 114 as shown in "Step 3" of FIG. 2. Thereafter, the pod top 120 is lowered to once again mate with the pod door, and the latching mechanism couples the top and door together so that the pod is sealed as shown in "Step 4" of FIG. 2. The pod 116 may thereafter be transferred away from the platform 114.

The empty lot box 130 may remain on platform 128 in the open position so that a cassette from a subsequent pod loaded onto platform 114 may be transferred from the pod into the lot box. In order to transfer the cassette from the pod to the box, the transfer system 112 operates in the reverse relative to that described above, i.e., the gripper 136 removes the cassette from the pod door, and the cassette is transferred through the frame and rotated counterclockwise relative to the view in FIG. 2 so that the wafers are oriented in a substantially vertical plane. The cassette is then set down within the lot box. The box may then be transferred away from the platform 128, and the open pod may remain in position to accept the cassette from the next lot box. This process may continue to transfer cassettes between SMIF pods and lot boxes as desired.

One system in which the present invention may be employed is in a fab including some tool bays which utilize SMIF technology and SMIF pods, and other bays which utilize lot boxes. In such a fab, an interbay transport may, for example, transfer lot boxes to a stocker within a tool bay that operates with SMIF pods. The system according to the present invention then transfers the cassettes as needed from the lot boxes in the stocker to the SMIF pods, which are then circulated around in the tool bay. Similarly, another interbay transport may transfer SMIF pods to a stocker within a tool bay that operates with lot boxes. The system according to the present invention then transfers the cassettes as needed from the SMIF pods in the stocker to the lot boxes, which are then circulated around in the tool bay.

It is understood however that the present invention may be used in a wide variety of other systems where it is desired to transfer cassettes between SMIF pods and lot boxes. Those of skill in the art would further appreciate that the present invention is not limited to SMIF pods and lot boxes, but is instead directed more broadly to a system capable of transferring a cassette from a first container to a second, dissimilar container. In a further embodiment, the lot box may be omitted and a bare cassette may be loaded onto the platform 128 for transfer to and from the SMIF pod by the transfer system 112.

After a cassette has been loaded into a pod 116 and the pod sealed, the air within the pod is that of the surrounding wafer fab. In order to purge and purify the air within the sealed pod, the pod door and platform 114 may further include a gas purging and conditioning system for passing clean air or other gas through the pod to remove particulates and contaminants. Details relating to purging and valve systems which could be used in accordance with the present invention are set forth for example in the following patents and patent applications, each of which is assigned to the owner of the present invention and each of which is incorporated by reference herein in its entirety:

U.S. Pat. No. 4,724,874, entitled "Sealable Transportable Container Having A Particle Filtering System", to Parikh et al.;

U.S. Pat. No. 5,169,272, entitled "Method And Apparatus For Transferring Articles Between Two Controlled Environments", to Bonora et al.;

U.S. Pat. No. 5,370,491, entitled "Method And Apparatus For Transferring Articles Between Two Controlled Environments", to Bonora et al.;

U.S. Pat. No. 5,547,328, entitled "Method And Apparatus For Transferring Articles Between Two Controlled Environments", to Bonora et al.;

U.S. patent application Ser. No. 09/049,061, entitled "Evacuation-Driven SMIF Pod Purge System", to Fosnight et al.;

U.S. patent application Ser. No. 09/049,330, entitled "Kinematic Coupling Compatible, Passive Interface Seal", to Fosnight et al.;

U.S. patent application Ser. No. 09/049,354, entitled "Modular SMIF Pod Breather, Adsorbent, and Purge Cartridges", to Fosnight et al.; and U.S. patent application Ser. No. 09/204,320, entitled "Passively Activated Valve for Carrier Purging", to Fosnight et al.

As explained hereinafter, a car may be used instead of the platform 114. In such embodiments, in order to purge a pod after a new cassette has been loaded therein, the pod may be transferred by the car to a stand-alone purging station including purging and valve systems as those described above. It is also contemplated that the car itself may have purging capabilities to purge a newly sealed pod.

The pod 116 and/or box 130 may include a bar code or other indicial mark including information relating to the pod or box. Additionally or alternatively, the pod 116 and box 130 may include an RF pill including a transponder for transmitting information relating to the pod, box and/or cassette therein. Such RF pills, and systems making use thereof, are described for example in U.S. Pat. Nos. 4,827,110 and 4,888,473 to Rossi et al., and U.S. Pat. No. 5,339,074 to Shindley. The container may alternatively include an IR tag. Such IR tags, and systems making use thereof, are described for example in U.S. Pat. Nos. 5,097,421, 4,974,166 and 5,166,884 to Maney et al. Each of the above-identified patents is assigned to the owner of the present invention, and each is incorporated by reference in its entirety herein. It is understood that the information transmitted by the pill or tag on a pod or box can change when the cassette within that pod or box changes.

As indicated above, while a preferred embodiment of the invention operates with either the pod or the box being initially empty, it is further contemplated that both the pod and box initially have a cassette stored therein. In this embodiment, a temporary buffer location is further provided in the mechanism 100. Details relating to such a buffer system are disclosed in U.S. patent application Ser. No. 09/313,945, entitled, "Cassette Buffering Within a Minienvironment" to Bonora et al., which application is assigned to the owner of the present invention and which application is incorporated by reference in its entirety herein. In accordance with this embodiment, a cassette from either the pod or box is initially stored on the buffer location, the other cassette transferred, and then the cassette on the buffer location transferred.

Figure 3:
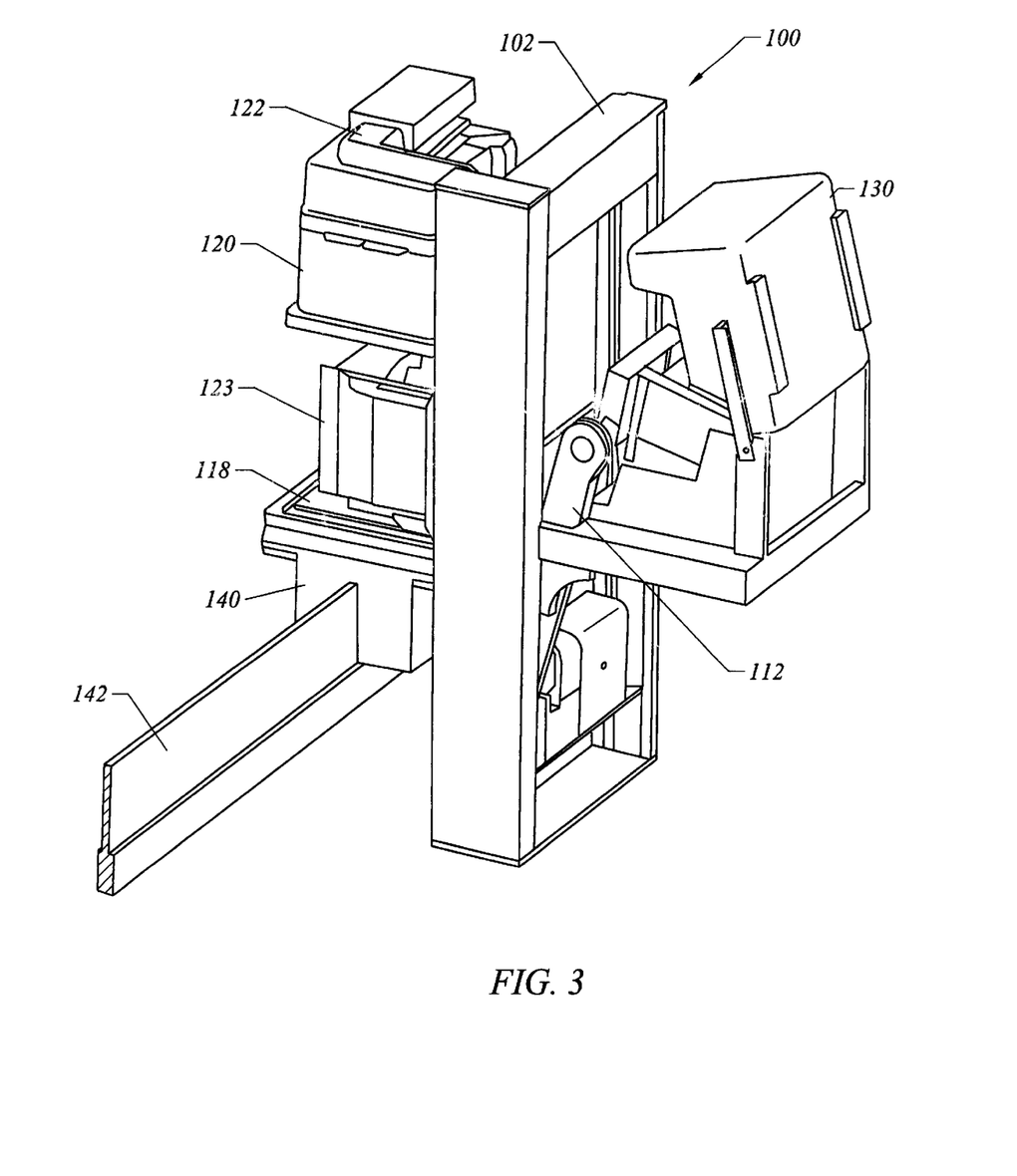
FIG. 3 is a perspective view of an alternative embodiment of the workpiece transport mechanism according to the present invention.

As indicated above instead of having a platform 114, an automated car used to transfer a pod around a fab may be positioned directly adjacent the frame 102 of a mechanism 100 so that cassette transfer may thereafter take place as described above between the pod and box. Such a system is shown for example in FIG. 3. As shown therein, a car 140 is transported around the wafer fab on a rail 142 (a section of which is shown in FIG. 3). It is understood that various other automated transport systems for moving pods/boxes around the fab may be substituted for the car 140 and/or rail 142 in alternative embodiments. The pod is seated on top of the car, preferably on registration pins or the like to ensure that the pod is correctly seated on the car. Once a car reaches a wafer transfer mechanism 100, proper positioning of the car 140 relative to the mechanism 100 may be indicated by sensors (not shown). Thereafter, cassette transfer to and from the pod on the car may take place as described above. Once transfer is complete, the car moves on so that another may take its place.

Figure 4:
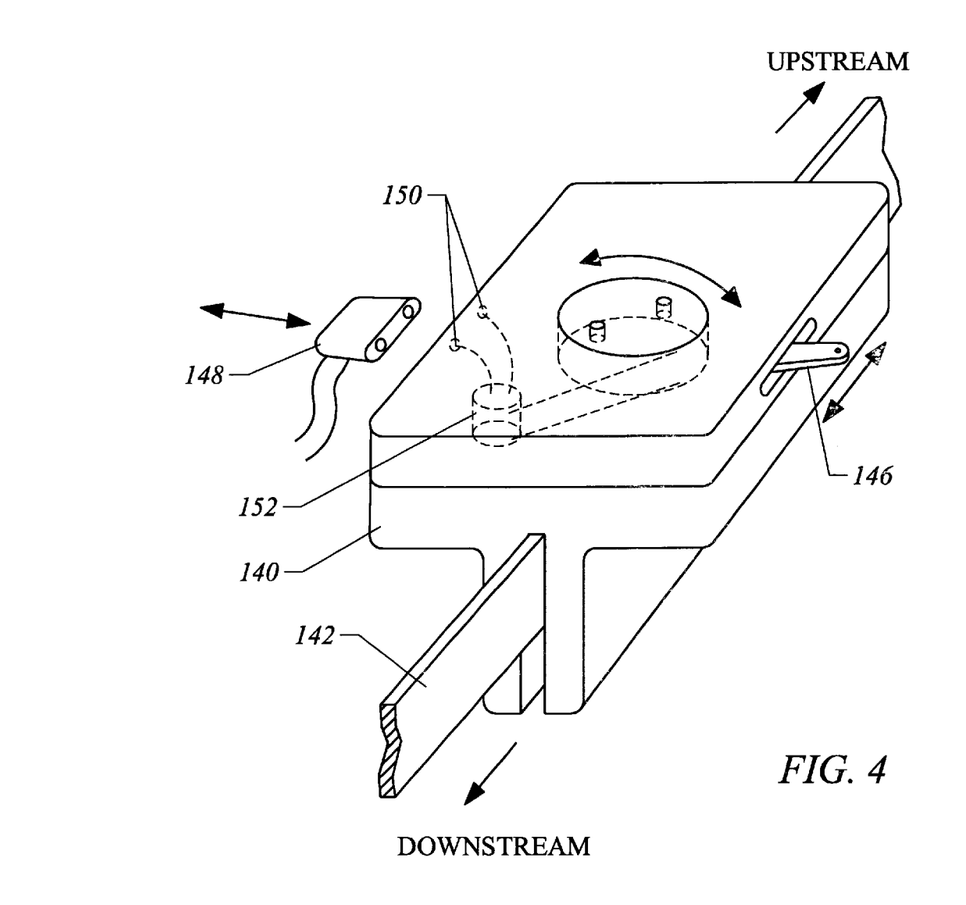
FIG. 4 is a perspective view of the support platform of the alternative embodiment of the workpiece transport mechanism shown in FIG. 3.

It is contemplated that the car may have a motor for actuating the latching mechanism that couples and decouples the pod door and top. However, in an alternative embodiment, the car may not have such a motor. In this embodiment, as shown in FIG. 4, the latching mechanism 144 may be mechanically actuated by a lever 146 coming into contact with a portion of the stationary mechanism 100. In particular, the lever may normally be biased into a forward position (i.e. toward the "upstream" direction) so that the latching mechanism 144 maintains the pod door and top coupled together. Upon approaching a cassette transfer mechanism 100, the lever may engage against a portion the mechanism 100, for example a member (not shown) mounted in frame 102. Alternatively, the member which engages the lever may be mounted on the other side of rail 142 from the wafer transfer mechanism 100. The member holds the lever stationary as the car moves slightly forward to its proper position at the mechanism 100, thereby resulting in the lever moving to rearward relative to the car. The force imparted to the lever is in turn communicated to the latch mechanism, to thereby rotate the latch mechanism to decouple the pod door from the pod top. After transfer is complete, continued movement of the car upstream frees the lever 146 from the member to thus return the lever to its forward position and to thus rotate the latching mechanism to its coupling position.

Instead of a stationary member in the wafer transfer mechanism 100, after the car comes to rest in position at the mechanism 100, the lever may be actuated by an active member mounted in the mechanism 100. As would be appreciated by those of skill in the art, a wide variety of other systems may be employed in the place of an internal motor for actuating the latching mechanism. In embodiments of the invention where the car includes an internal motor for actuating the latching mechanism, power may be supplied to the motor from a wide variety of sources. The car may include a battery, or a portion of the rail may carry a current which is communicated to the motor when the car is properly positioned at a mechanism 100. As a further alternative, as shown in FIG. 4, a power source 148 may move into engagement with electrical contacts 150 on the side of the car 140 once the car comes to a stop at a mechanism 100, whereupon current is supplied to run a motor 152 within the car to actuate the latching mechanism. The power source 148 may be on the same or different side of the rail 142 than the mechanism 100, with the electrical contacts positioned accordingly.

Figure 5:
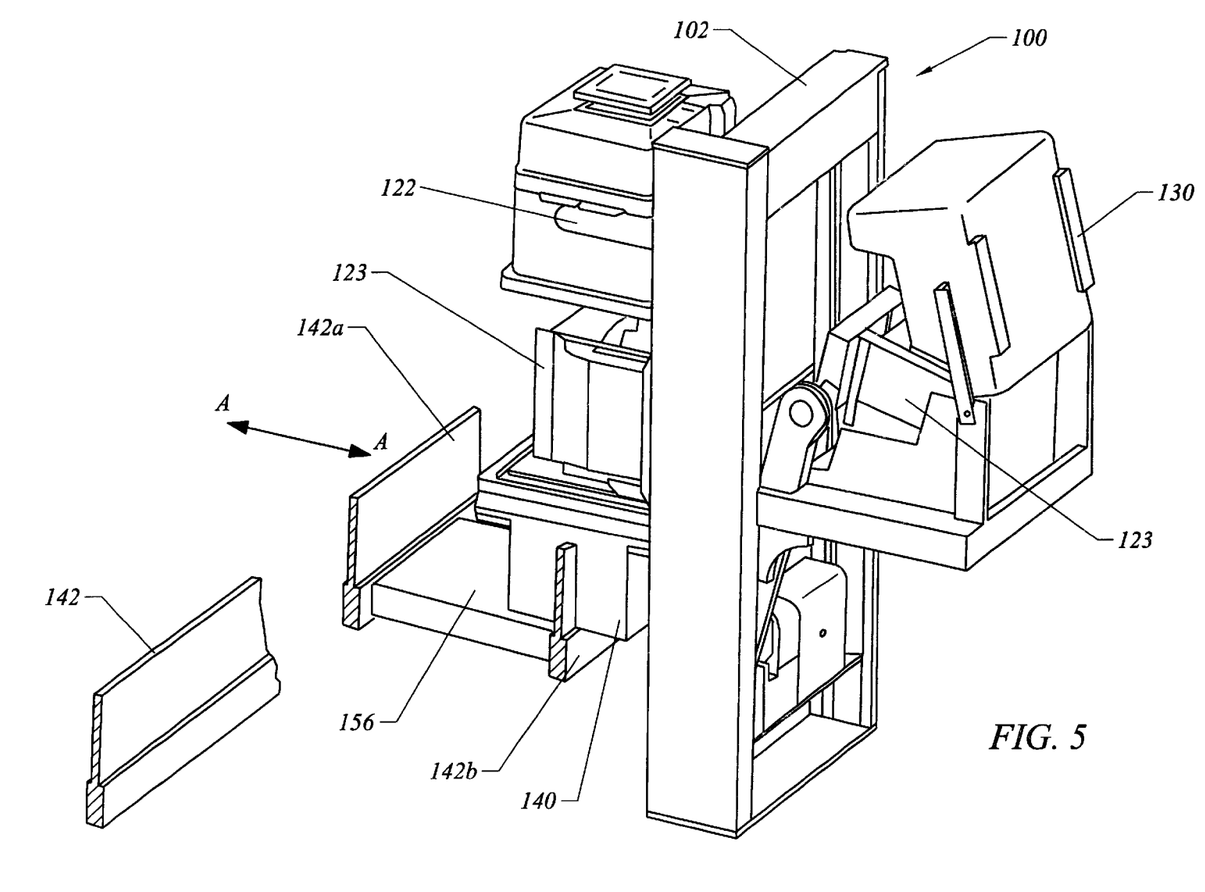
FIG. 5 is a perspective view of an alternative embodiment of the workpiece transport mechanism according to the present invention.

It maybe desirable to have a car 140 and its associated SMIF pod shifted off of the main rail 142 during the cassette transfer operation to prevent the blocking of other cars traveling on the rail. In order to accomplish this, as shown in FIG. 5, a unit section 156 may be provided adjacent a mechanism 100, which section 156 is mounted to translate in the direction of arrow A—A. The unit section 156 includes a pair of rail sections 142a and 142b. As the car 140 approaches the mechanism 100, the rail section 142b is aligned with the main rail 142 (not shown in FIG. 5). Once the car 140 has come to a stop at its proper position, the unit section 156 with the car on rail section 142b moves toward the mechanism so that cassette transfer may take place as described above. With the unit section 156 shifted toward the mechanism 100, the rail section 142a aligns with the main rail 142 to allow other cars to pass unobstructed (although not indicated in FIG. 5, there would be only a small space between the main rail 142 and rail sections 142a/142b when they are aligned respectively with the main rail). After cassette transfer is completed, the unit section 156 would again move back away from the mechanism 100 so that the rail section 142b carrying the car 140 once again aligns with the main rail 142, and the car can continue down the main rail.

While the pod 116 has generally been described above as being seated on the car 140 as the car moves through the fab, it is understood that in each of the above-described embodiments, the relative positions of the pod and box may be switched so that it is the box that is seated on the car.

Figure 6:
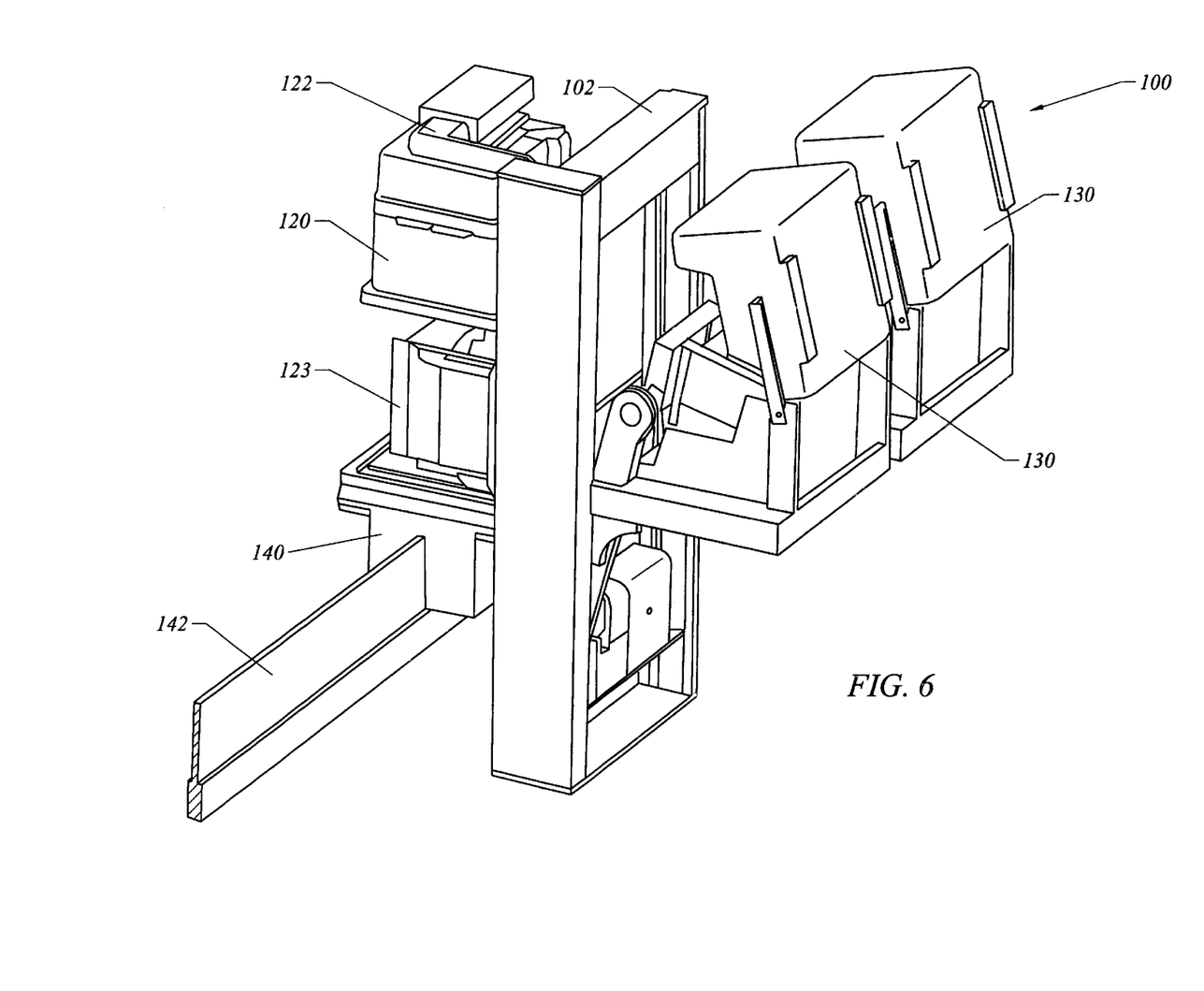
FIG. 6 is a perspective view of an alternative embodiment of the workpiece transport mechanism according to the present invention.

In a preferred embodiment, when a cassette is transferred for example from a pod to an empty box, it takes time for the box to be carried away and another box containing a new cassette retrieved and its cassette loaded into the waiting pod. In order to reduce this cycle time, as shown in FIG. 6, an empty box 130 and box 130 initially having a cassette therein may both be located at the mechanism 100. A shuttle or transport mechanism can be used to switch the positions of the boxes on the platform 128 when necessary. As a further alternative, side-by-side mechanisms 100 may be provided so that, for example, after a cassette is transferred from a pod to an empty box at one mechanism, the pod can move to the adjacent mechanism to receive the cassette from the box at the second mechanism.

Although the invention has been described in detail herein, it should be understood that the invention is not limited to the embodiments herein disclosed. Various changes, substitutions and modifications may be made thereto by those skilled in the art without departing from the spirit or scope of the invention as described and defined by the appended claims.

We claim:

1. A transport mechanism for transporting a workpiece carrier within a semiconductor wafer fab, comprising:

a frame having a first support and a second support spaced apart from said first support so that a workpiece carrier may pass between;

a SMIF pod opener, including a support platform extending from said frame for supporting a SMIF pod having a pod shell and a pod door, and a pod top lifter for separating said pod shell from said pod door;

a lot box opener, including a platform extending from said frame for supporting a lot box, and a lifting mechanism for opening and closing a lot box; and a transfer mechanism mounted between said first support and said second support, for transferring the workpiece carrier between the SMIF pod and the lot box.

2. A transport mechanism for transporting a workpiece carrier within a semiconductor wafer fab as recited in claim 1, the SMIF pod supporting the workpiece carrier with a workpiece in a horizontal plane and the lot box supporting the workpiece carrier with a workpiece in a substantially non-horizontal plane.

3. A transport mechanism for transporting a workpiece carrier within a semiconductor wafer fab as recited in claim 2, said transfer mechanism comprising an arm and a gripper pivotally mounted to said arm, said gripper capable of moving the workpiece carrier between a first position where the workpiece is in said horizontal plane and a second position where the workpiece is in said substantially non-horizontal plane.

4. A transport mechanism for transporting a workpiece carrier within a semiconductor wafer fab, comprising:

a frame having a first mounting side and a second mounting side opposite and facing away from said first mounting side;

a first platform for receiving a SMIF container having a pod door and a pod shell, said first platform extending from and mounted to said first mounting side of said frame;

a second platform for receiving a lot box, said second platform extending from and mounted to said second mounting side of said frame;

a SMIF pod opener mounted to said first mounting side, for separating the pod door from the pod shell and for securing the pod door to the pod shell;

a lot box opener mounted to said second mounting side, for opening and closing the lot box; and a transfer mechanism, mounted to said frame, for transferring the workpiece carrier between the SMIF container located on said first platform and the lot box located on said second platform.

5. A transport mechanism for transporting a workpiece carrier within a semiconductor wafer fab as recited in claim 4, wherein said first platform is fixedly mounted to said first side of said frame.

6. A transport mechanism for transporting a workpiece carrier within a semiconductor wafer fab as recited in claim 4, wherein said second platform is fixedly mounted to said second side of said frame.

7. A transport mechanism for transporting a workpiece carrier within a semiconductor wafer fab as recited in claim 4, the SMIF pod supporting the workpiece carrier with a workpiece in a horizontal plane and the lot box supporting the workpiece carrier with a workpiece in a substantially non-horizontal plane.

8. A transport mechanism for transporting a workpiece carrier within a semiconductor wafer fab as recited in claim 7, said transfer mechanism comprising an arm and a gripper pivotally mounted to said arm, said gripper capable of moving the workpiece carrier between a first position where the workpiece is in said horizontal plane and a second position where the workpiece is in said substantially non-horizontal plane.

9. A method of transporting workpiece carriers between SMIF pods having a pod door and a pod shell, and lot boxes having a pivotally mounted top, the method comprising the steps of:

(a) supporting the SMIF pod on a first platform adjacent a first side of a transfer mechanism, the SMIF pod isolating the workpiece carrier from ambient atmospheric conditions;

(b) separating the SMIF pod shell from the pod door to provide access to the workpiece carrier;

(c) supporting the lot box on a second platform adjacent a second side of the transfer mechanism such that the lot box and SMIF pod are located on opposite sides of the transfer mechanism;

(d) opening the lot box;

(e) gripping the workpiece carrier with a gripper of the transfer mechanism;

(f) transporting the workpiece carrier gripped in said step (e) from the SMIF pod into the lot box.

10. A method of transporting workpiece carriers between SMIF pods having a pod shell and a pod door, and lot boxes, the method comprising the steps of:

(a) supporting the SMIF pod on a first platform adjacent a first side of a transfer mechanism;

(b) separating the pod shell from the pod door;

(c) supporting the lot box isolating the workpiece carrier from ambient outside conditions on a second platform adjacent a second side of the transfer mechanism so that the lot box and SMIF pod are located on opposite sides of the transfer mechanism;

(d) opening the lot box;

(e) gripping the workpiece carrier located in the lot box with a gripper of the transfer mechanism;

(f) transporting the workpiece carrier gripped in said step (e) from the lot box to the SMIF pod.

* * * * *